(12) United States Patent
Koo

(10) Patent No.: US 7,268,604 B2
(45) Date of Patent: Sep. 11, 2007

(54) COMPARATOR WITH HYSTERESIS AND METHOD OF COMPARING USING THE SAME

(75) Inventor: Gye-Soo Koo, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 4 days.

(21) Appl. No.: 11/251,471

(22) Filed: Oct. 14, 2005

(65) Prior Publication Data

US 2006/0082392 A1    Apr. 20, 2006

(30) Foreign Application Priority Data

Oct. 15, 2004    (KR) ................ 10-2004-0082438

(51) Int. Cl.
*H03K 3/00* (2006.01)
(52) U.S. Cl. .................................. 327/206; 327/65
(58) Field of Classification Search ............ 327/63–65, 327/205, 206
See application file for complete search history.

(56) References Cited

U.S. PATENT DOCUMENTS

| | | | |
|---|---|---|---|
| 4,897,569 A * | 1/1990 | Calzi .......................... 327/206 |
| 6,060,925 A * | 5/2000 | Chou .......................... 327/206 |
| 6,181,172 B1 | 1/2001 | Callahan ..................... 327/143 |
| 6,208,187 B1 | 3/2001 | Callahan, Jr. ................ 327/206 |
| 6,356,099 B1 * | 3/2002 | Lee et al. ..................... 326/24 |
| 6,420,909 B1 | 7/2002 | Barnes ......................... 327/63 |
| 6,440,851 B1 | 8/2002 | Agnello et al. ............. 438/682 |
| 6,444,578 B1 | 9/2002 | Cabral et al. ............... 438/682 |
| 6,479,358 B1 | 11/2002 | Yu .............................. 438/300 |
| 6,700,424 B2 * | 3/2004 | Feng ........................... 327/206 |
| 6,890,391 B2 | 5/2005 | Aoki et al. ................... 134/32 |
| 6,946,371 B2 | 9/2005 | Langdo et al. .............. 438/481 |
| 2002/0135017 A1 | 9/2002 | Vogt et al. ................... 257/351 |
| 2002/0142616 A1 | 10/2002 | Giewont et al. ............. 438/175 |
| 2005/0122138 A1 * | 6/2005 | Chansungsan et al. ........ 327/78 |
| 2005/0252443 A1 | 11/2005 | Tsai et al. ..................... 117/84 |

* cited by examiner

*Primary Examiner*—Kenneth B. Wells
*Assistant Examiner*—Ryan Jager
(74) *Attorney, Agent, or Firm*—Marger Johnson & McCollom, P.C.

(57) ABSTRACT

A comparator includes a differential amplifier, and a hysteresis circuit. The differential amplifier amplifies a difference signal corresponding to a difference between input signals. The hysteresis circuit sets up a first transition threshold voltage and a second transition threshold voltage where the second transition threshold is different from the first transition threshold voltage. The hysteresis circuit generates a second signal that makes transition at the first transition threshold voltage when the difference signal changes in a first direction, and makes transition at the second transition threshold voltage when the difference signal changes in a second.

8 Claims, 7 Drawing Sheets

COMPARATOR WITH HYSTERESIS AND METHOD OF COMPARING USING THE SAME

CROSS-REFERENCE TO RELATED APPLICATIONS

This application relies for priority upon Korean Patent Application No. 2004-82438 filed on Oct. 15, 2004, the contents of which are herein incorporated by reference in its entirety.

BACKGROUND OF THE INVENTION

1. Field of the Invention

This disclosure relates to comparators and comparing methods, particularly to comparators and comparing methods with hysteresis.

2. Description of the Related Art

A comparator is an electronic device used in comparing two signals.

FIG. 1 is a circuit diagram showing a conventional comparator. Referring to FIG. 1, the comparator includes a differential amplifier 10 and a buffer circuit 20. The differential amplifier 10 receives two input signals VIN1 and VIN2 and amplifies a difference between the two signals VIN1 and VIN2. The buffer circuit 20 includes inverters connected in cascade, and receives and buffers an output signal VAO of the differential amplifier 10. However, the comparator having the circuit configuration of FIG. 1 may not have immunity from noise when the noise is part of input with the input signals VIN1 and VIN2.

FIG. 2 is a circuit diagram showing another conventional comparator with a hysteresis circuit 32 included in the differential amplifier 30. The hysteresis circuit 32 has a latching function, and has different thresholds when the voltage level rises and when the voltage level falls because the voltage levels of nodes N1 and N2 change according to the input signals VIN1 and VIN2. The output signal VAO of the differential amplifier 30 and the output signal VOUT of the comparator may have hysteresis if the comparator has different thresholds when the voltage level rises compared to when the voltage level falls. Therefore, the noise immunity of the comparator shown in FIG. 2 may be larger than that of the comparator shown in FIG. 1. However, the operable frequency range of input signals may be decreased and the degree of the increase of the noise immunity may not be very large.

SUMMARY OF THE INVENTION

An embodiment of the invention provides a comparator including a differential amplifier to amplify a difference between input signals of the differential amplifier, and a hysteresis circuit to set up a first transition threshold voltage and a second transition threshold voltage where the second transition threshold voltage is different from the first transition threshold voltage, and to generate a hysteresis output signal that makes a transition at the first transition threshold voltage when the difference signal changes in a first direction, and makes a transition at the second transition threshold voltage when the difference signal changes in a second direction.

An embodiment of the invention includes a method of comparing including amplifying a difference signal, setting up a first transition threshold voltage and a second transition threshold voltage where the second transition threshold voltage is different from the first transition threshold voltage, and generating a second signal that makes a transition at the first transition threshold voltage when the difference signal changes in a first direction, and makes a transition at the second transition threshold voltage when the difference signal changes in a second direction.

BRIEF DESCRIPTION OF THE DRAWINGS

The foregoing and other features and advantages of the invention will be apparent from more particular descriptions of embodiments of the invention, as illustrated in the accompanying drawings. The drawings are not necessarily to scale; emphasis instead is placed upon illustrating the principles of the invention. Like reference characters refer to like elements throughout the drawings.

DESCRIPTION OF EMBODIMENTS

Detailed illustrative embodiments of the invention are disclosed herein. However, specific structural and functional details disclosed herein are merely representative and used for purposes of describing embodiments of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
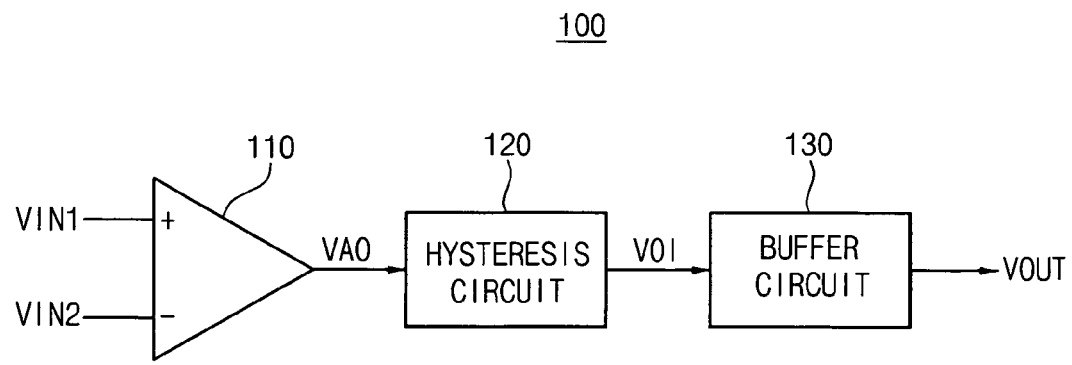
FIG. 3 is a block diagram showing a comparator according to an embodiment of the invention.

FIG. 3 is a block diagram showing a comparator according to an embodiment of the invention. Referring to FIG. 3, the comparator 100 includes a differential amplifier 110, a hysteresis circuit 120, and a buffer circuit 130.

The differential amplifier receives input signals VIN1 and VIN2 and amplifies a difference signal corresponding to a difference between the input signals VIN1 and VIN2. The hysteresis circuit 120 inverts the output signal VAO of the amplifier 110, and sets up an upward transition threshold voltage and a downward transition threshold voltage, where the downward transition threshold voltage is lower than the upward transition threshold voltage. Furthermore, the hysteresis circuit 120 generates a signal VOI that makes a transition at the upward transition threshold voltage when the difference signal rises, and makes a transition at the downward transition threshold voltage when the difference signal falls. The difference between the upward transition threshold voltage and the downward transition threshold voltage corresponds to the amount of hysteresis. The output signal VOI of the hysteresis circuit 120 corresponds to the inverted signal of the output signal VAO of the differential amplifier 110. The buffer circuit 130 buffers and inverts the output signal VOI of the hysteresis circuit 120. The output signal VOUT of the buffer circuit 130 has a hysteresis characteristic and an inverted phase with respect to the phase of the hysteresis circuit 120.

Accordingly, the comparator 100 can increase the noise immunity of the comparator by including the hysteresis circuit 120 that has the upward transition threshold voltage and the downward transition threshold voltage, where the upward transition threshold voltage has different voltage level from the downward transition threshold voltage.

Figure 4:
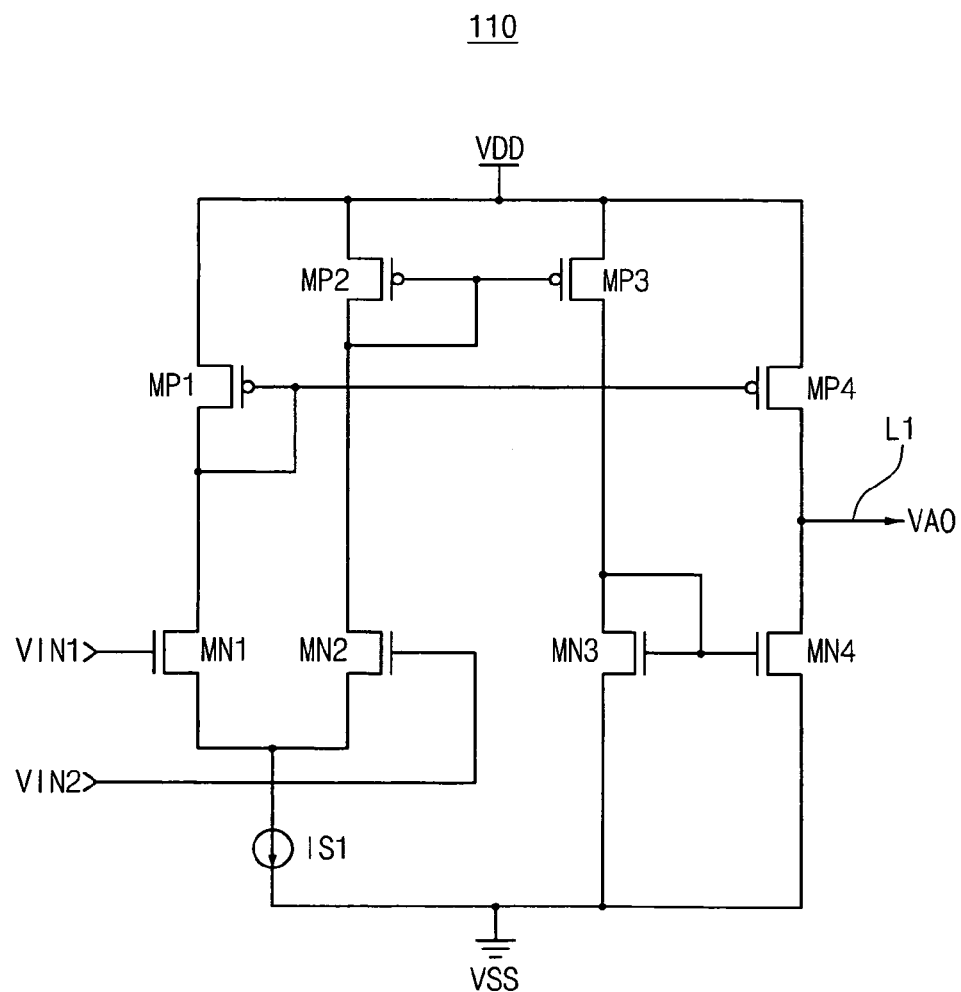
FIG. 4 is a circuit diagram showing an example of a differential amplifier of FIG. 3.

FIG. 4 is a circuit diagram showing an example of a differential amplifier 110 of FIG. 3.

Referring to FIG. 4, the differential amplifier 110 includes NMOS transistors MN1 to MN4, PMOS transistors MP1 to MP4, and a current source IS1. NMOS transistors MN1 and MN2 receive the input signals VIN1 and VIN2, respectively. The current source IS1 is coupled between the ground and the conjunction point of the NMOS transistor MN1 and the NMOS transistor MN2. A drain and a gate of the PMOS transistor MP1 are commonly coupled to a drain of the NMOS transistor MN1, and a source of the PMOS transistor MP2 is coupled to the supply voltage VDD. A gate of the PMOS transistor MP3 is coupled to a gate of the PMOS transistor MP2, and a source of the PMOS transistor MP3 is coupled to the supply voltage VDD. A gate and a drain of NMOS transistor MN3 are commonly coupled to a drain of the PMOS transistor MP3, and a source of the NMOS transistor MN3 is coupled to the ground. A gate of the NMOS transistor MN4 is coupled to the gate of the NMOS transistor MN3, and a source of the NMOS transistor MN4 is coupled to the ground. A gate of the PMOS transistor MP4 is coupled to the gate of the PMOS transistor MP1, and a source of the PMOS transistor MP4 is coupled to the supply voltage VDD. A drain of the PMOS transistor MP4 is coupled to the output line L1.

The input signals VIN1 and VIN2 may be a differential signal pair. The NMOS transistors MN1 and MN2 may be a differential transistor pair for amplifying a difference between the two input signals VIN1 and VIN2. When the input signal VIN1 is larger than the input signal VIN2, the voltage VAO of the output line L1 makes transition from a low state to a high state. Alternatively, when the input signal VIN1 is smaller than the input signal VIN2, the voltage VAO of the output line L1 makes transition from a high state to a low state.

Figure 5:
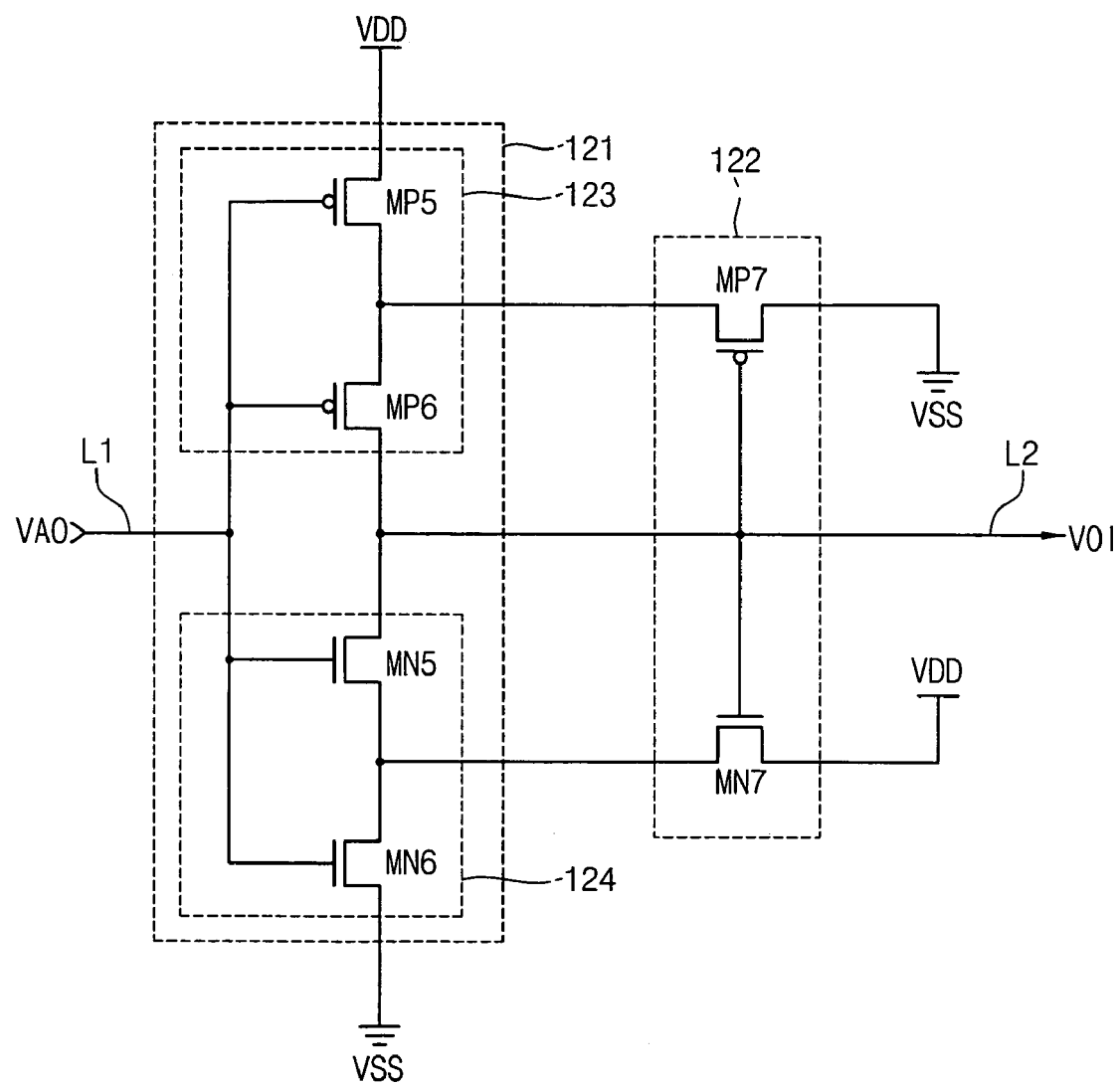
FIG. 5 is a circuit diagram showing an example of a hysteresis circuit of FIG. 3.

FIG. 5 is a circuit diagram showing an example of a hysteresis circuit 120 of FIG. 3. The hysteresis circuit 120 includes an inverting unit 121 for inverting the output voltage VAO of the differential amplifier 110 and a hysteresis-threshold setting unit 122 for setting an upward transition threshold voltage and a downward transition threshold voltage. The inverting unit 121 includes a pull-up driver 123 and a pull-down driver 124.

The pull-up driver 123 includes PMOS transistors MP5 and MP6. The PMOS transistor MP5 has a source coupled to the supply voltage VDD and a gate to which the output voltage VAO of the differential amplifier 110 is applied. The PMOS transistor MP6 has a source coupled to a drain of the PMOS transistor MP5, a gate to which the output voltage VAO of the differential amplifier 110 is applied, and a drain coupled to the output terminal L2 of the hysteresis circuit 120.

The pull-down driver 124 includes NMOS transistors MN5 and MN6. The NMOS transistor MN6 has a source coupled to the ground and a gate to which the output voltage VAO of the differential amplifier 110 is applied. The NMOS transistor MN5 has a source coupled to a drain of the NMOS transistor MN6, a gate to which the output voltage VAO of the differential amplifier 110 is applied, and a drain coupled to the output terminal L2 of the hysteresis circuit 120.

The hysteresis-threshold setting unit 122 includes a PMOS transistor MP7 and an NMOS transistor MN7. The PMOS transistor MP7 is coupled between a drain of the PMOS transistor MP5 and the ground, and switches in response to the voltage level of the output terminal L2 of the hysteresis circuit 120. The NMOS transistor MN7 is coupled between a drain of the NMOS transistor MN6 and the supply voltage, and switches in response to the voltage level of the output terminal L2 of the hysteresis circuit 120.

Hereinafter, the operation of the hysteresis circuit 120 of FIG. 5 is described.

First, the operation of the pull-down driver 124 and the hysteresis-threshold setting unit 122 will be described.

When the output voltage VAO of the differential amplifier 110 having a logic level "low" is applied to the hysteresis circuit 120, the output signal VOI of the hysteresis circuit 120 becomes a logic level "high" because of the inverting unit 121. With a logic "High" on the output voltage VOI, the NMOS transistor MN7 having the hysteresis-threshold setting unit 122 is turned on, and the voltage level of the source of the NMOS transistor MN5 rises. As a result, the output voltage VAO of the differential amplifier 110 that turns on the NMOS transistor MN5 increases.

When the output voltage VAO makes a transition from a logic level "low" to a logic level "high", the output signal VOI of the hysteresis circuit 120 becomes a logic level "low". During the transition of the output voltage VAO, because of the increased voltage to turn on the NMOS transition MN5, the output signal VOI does not transition until the output voltage VAO passes the increased voltage, rather than a lower voltage if NMOS transistor MN7 was not used. After the transition, the NMOS transistor MN7 of the hysteresis-threshold setting unit 122 is turned off, and the voltage level of the source of the NMOS transistor MN5 returns to its original state. As a result, the output voltage VAO of the differential amplifier 110 that turns off the NMOS transistor MN5 during transition from a logic "high" to a logic "low" is lower than the threshold voltage previously required to turn on the NMOS transistor MN5.

Next, the operation of the pull-up driver 123 and the hysteresis-threshold setting unit 122 will be described.

When the output voltage VAO of the differential amplifier 110 having logic level "high" is applied to the hysteresis circuit 120, the output signal VOI of the hysteresis circuit 120 becomes logic "low" because of the inverting unit 121. With a logic on the output voltage VOI, the PMOS transistor MP7 of the hysteresis-threshold setting unit 122 is turned on, and the voltage level of the source of the PMOS transistor MP6 falls. Therefore, the output voltage VAO of the differential amplifier 110 that turns on the PMOS transistor MP6 decreases.

Then, when the output voltage VAO makes transition from a logic "high" to a logic "low", the output signal VOI of the hysteresis circuit 120 becomes logic "high". During the transition of the output voltage VAO, because of the decreased voltage to turn on the PMOS transistor MP6, the output signal VOI does not transition until the output signal VAO passes the decreased voltage, rather than the higher voltage if the PMOS transistor MP7 was not used. After the transition, the PMOS transistor MP7 of the hysteresis-threshold setting unit 122 is turned off, and the voltage level of the source of the PMOS transistor MP6 returns to its original state. As a result, the output voltage VAO of the differential amplifier 110 that turns off the PMOS transistor MP6 during a transition from a logic "low" to a logic "high" is higher than the threshold voltage previously required to turn on the PMOS transistor MP6.

Because of these operations, the output signal VOI of the hysteresis circuit 120 has a hysteresis characteristic. The threshold voltage during a rising transition is different from the threshold voltage during a falling transition.

Figure 6:
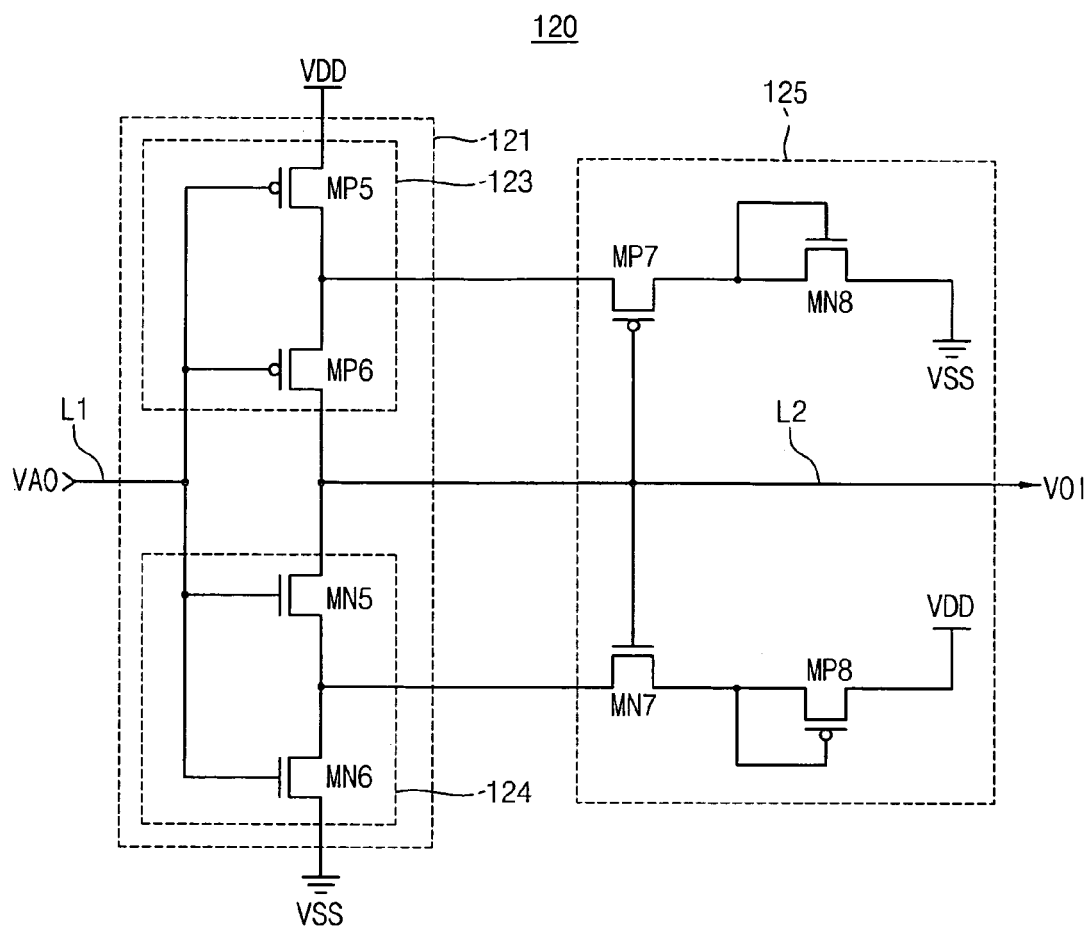
FIG. 6 is a circuit diagram showing another example of a hysteresis circuit of FIG. 3.

FIG. 6 is a circuit diagram showing another example of a hysteresis circuit 120 in FIG. 3.

The hysteresis circuit 120 of FIG. 6 is similar to that of FIG. 3 where the difference is that the circuit of FIG. 6 includes transistors MN8 and MP8 in the hysteresis-threshold setting unit 125.

Referring to FIG. 6, the hysteresis-threshold setting unit 125 includes PMOS transistors MP7 and MP8 and NMOS transistors MN7 and MN8. The PMOS transistor MP7 has a source coupled to a drain of the PMOS transistor MP5 and a gate coupled to the output terminal L2. The PMOS transistor MP7 switches in response to the voltage level of the output terminal L2 of the hysteresis circuit 120. The NMOS transistor MN8 is connected as a diode-connected structure, and is coupled between a drain of the PMOS transistor MP7 and the ground voltage VSS.

The NMOS transistor MN7 has a source coupled to the drain of the NMOS transistor MN6 and a gate coupled to the output terminal L2. The NMOS transistor MN7 switches in response to the voltage level of the output terminal L2 of the hysteresis circuit 120. The PMOS transistor MP8 is connected as a diode-connected structure, and is coupled between a drain of the NMOS transistor MN7 and the supply voltage VDD.

The transistors MN8 and MP8 are included in the hysteresis-threshold setting unit 125 in the hysteresis circuit 120 shown in FIG. 6 so as to cut off an electrostatic discharge (ESD) that may flow into the hysteresis circuit 120 from the ground voltage VSS or the supply voltage VDD.

Figure 7:
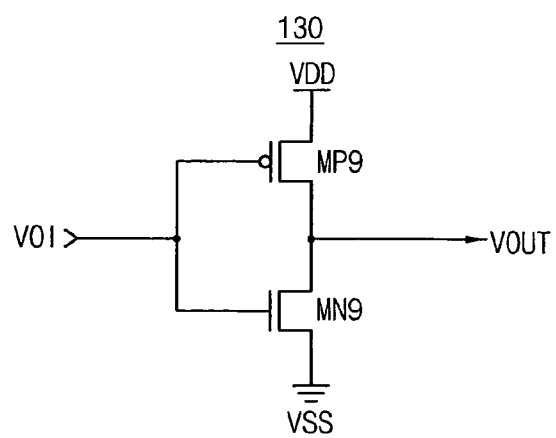
FIG. 7 is a circuit diagram showing an example of a buffer circuit of FIG. 3.

FIG. 7 is a circuit diagram showing an example of a buffer circuit 130 in FIG. 3. Referring to FIG. 7, the buffer circuit 130 includes an inverter including a PMOS transistor MP9 and an NMOS transistor MN9. When the output signal VOI of the hysteresis circuit 120 is a logic level "high", the output voltage signal VOUT is a logic level "low", and when the output signal VOI of the hysteresis circuit 120 is a logic level "low", the output voltage signal VOUT is a logic level "high".

Figure 8:
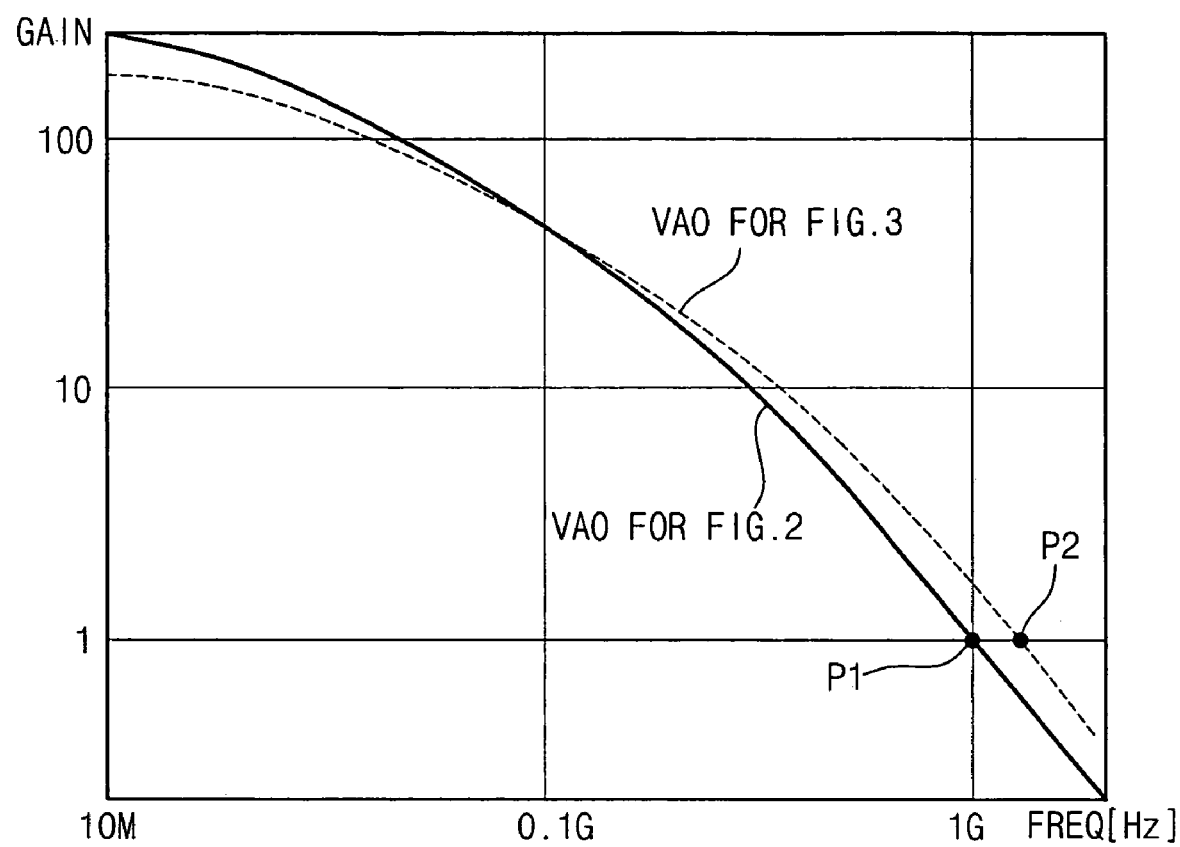
FIG. 8 is a simulation diagram illustrating frequency characteristics of a comparator according to an embodiment of the invention, compared with frequency characteristics of another conventional comparator.

FIG. 8 is a simulation diagram illustrating frequency characteristics of a comparator according to an embodiment of the invention, compared with a conventional comparator. The curve shown in a solid line represents the frequency characteristics of the conventional comparator, and the curve shown by the dotted line represents the frequency characteristics of the comparator according to an embodiment of the invention.

Figure 1:
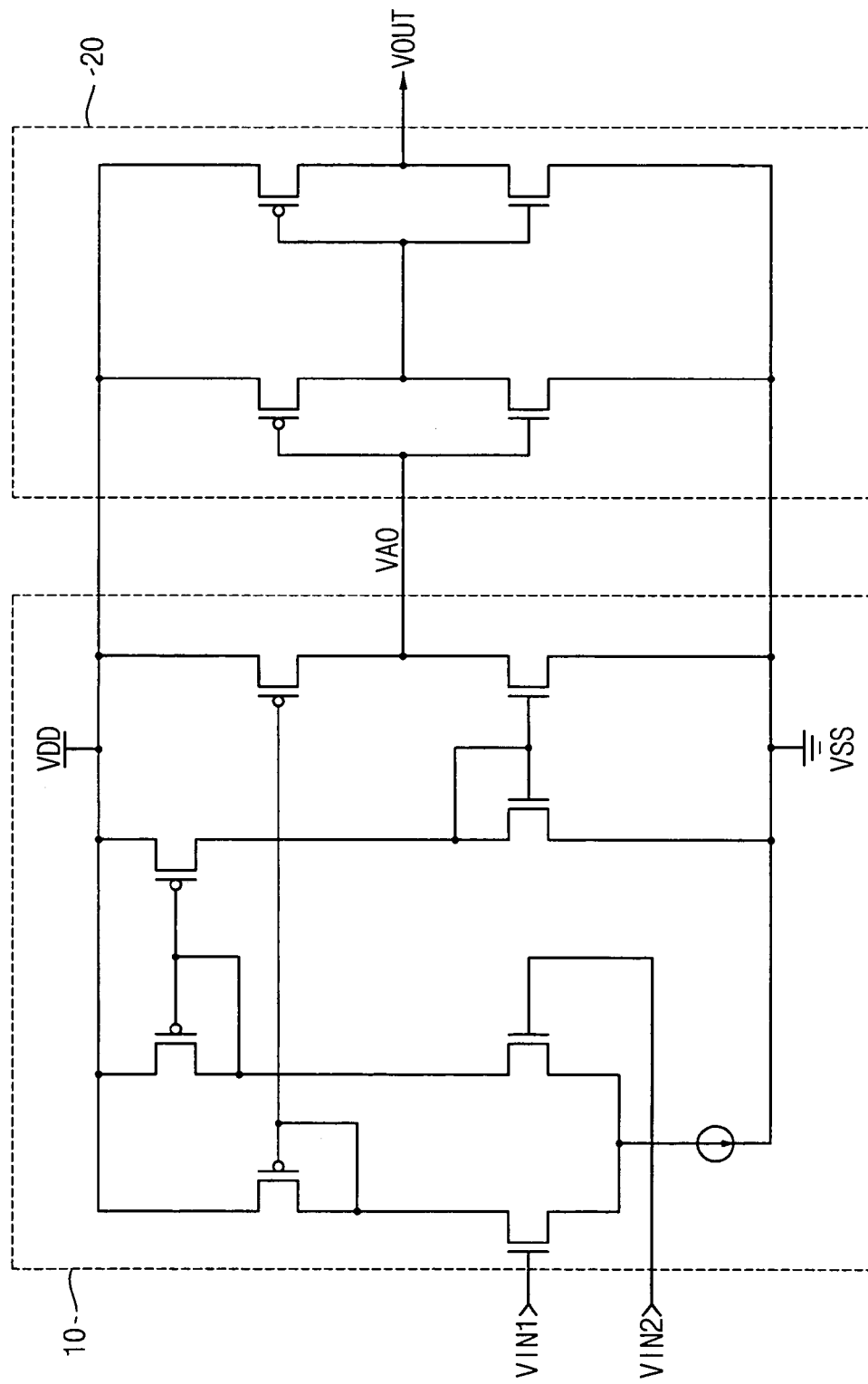
FIG. 1 is a circuit diagram showing a conventional comparator.
Figure 2:
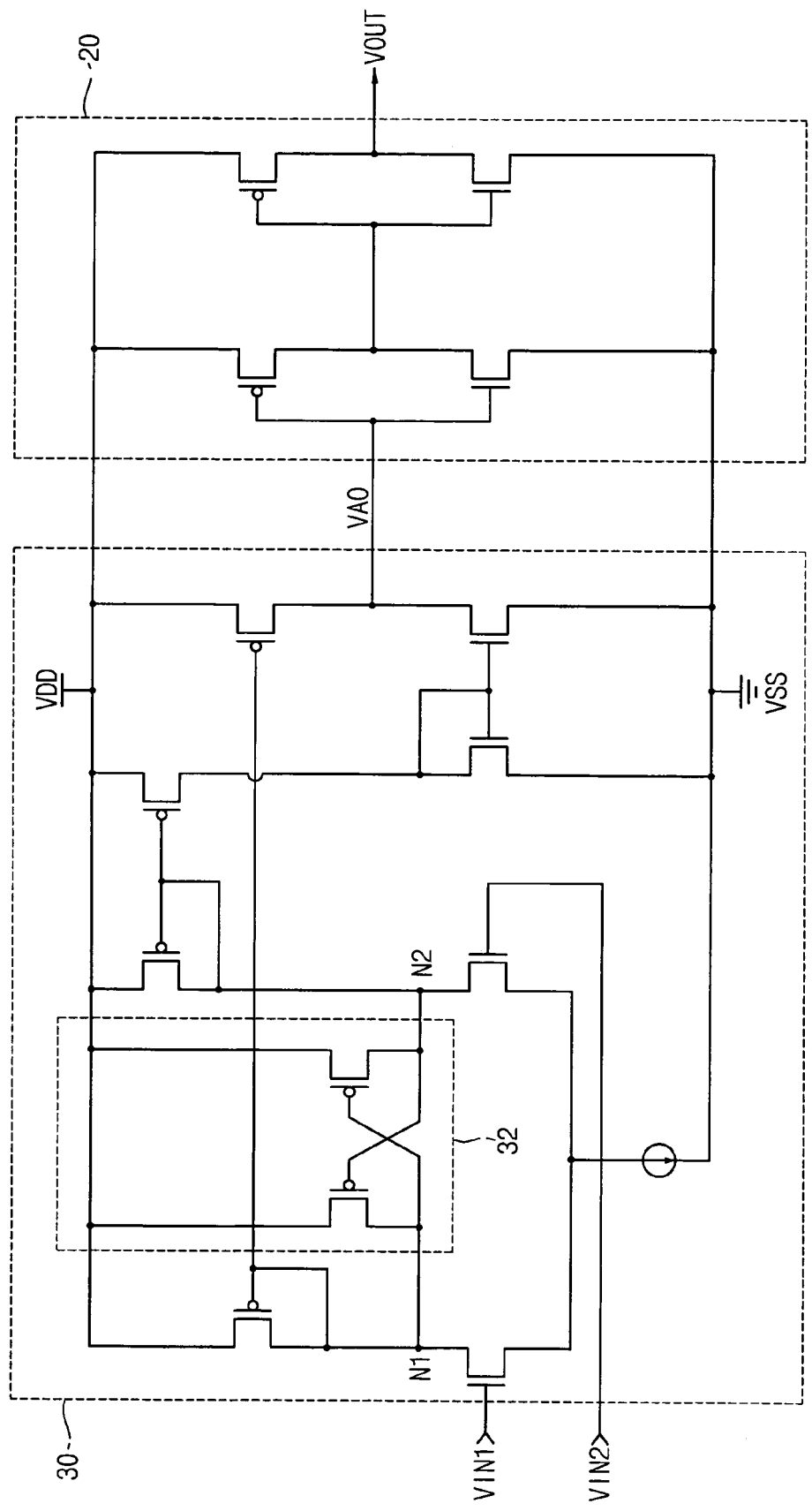
FIG. 2 is a circuit diagram showing another conventional comparator.

Referring to FIG. 8, the unity gain bandwidth for a comparator such as the comparator of FIG. 3, which is the frequency of P2, is larger than the unity gain bandwidth for the other comparator of FIG. 2. The bandwidth of the comparator of FIG. 2 is smaller because of the hysteresis circuit 32 added to the differential amplifier 30.

Figure 9:
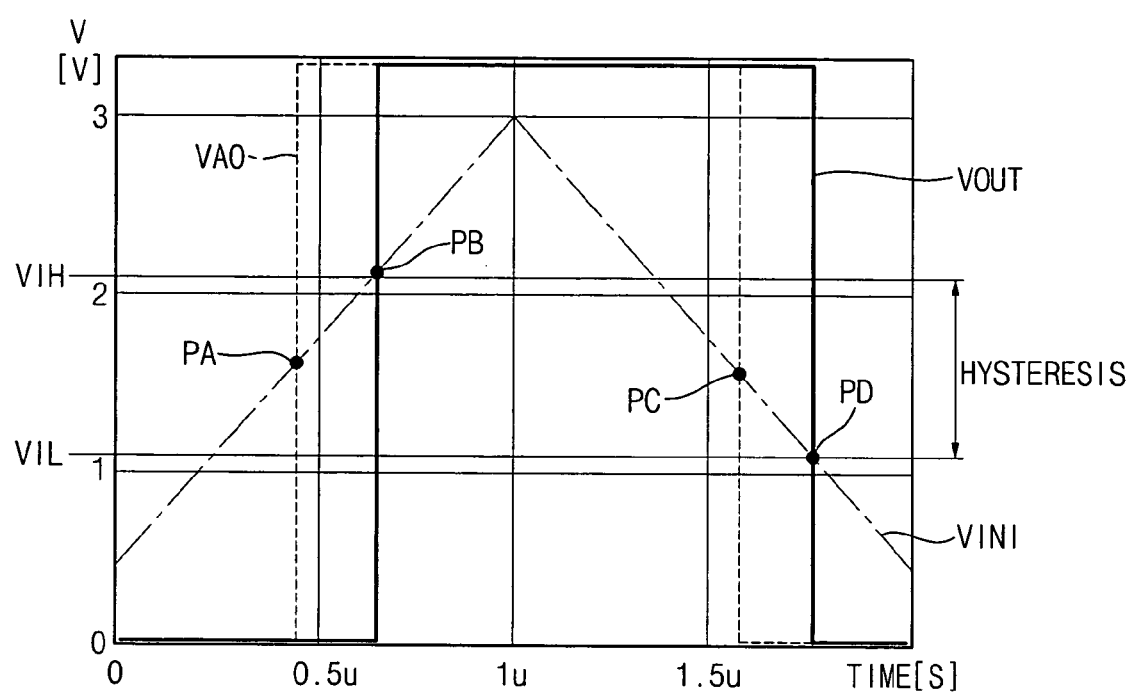
FIG. 9 is a simulation diagram illustrating an example of the input signal and the output signal of the comparator of FIG. 3.

FIG. 9 is a simulation diagram illustrating the input signal and the output signal of the comparator of FIG. 3.

FIG. 9 illustrates the output signal VAO of the differential amplifier and the output signal VOUT of the comparator when an input signal VIN2 is fixed and the other input signal VIN1 is varied.

Referring to FIG. 9, it can be noted that the threshold voltage VIH (PB) when the input signal VIN1 is rising is higher than the threshold voltage VIL (PD) when the input signal VIN1 is falling. That is, the upward transition threshold voltage VIH is higher than the downward transition threshold voltage VIL. The difference between the upward transition threshold voltage VIH and the downward transition threshold voltage VIL represents the amount of hysteresis.

In FIG. 9, PA represents the value of the input voltage VIN1 at which the output voltage VAO of the differential amplifier makes a rising transition, and PC represents the value of the input voltage VIN1 at which the output voltage VAO of the differential amplifier makes a falling transition. The output signal VAO of the differential amplifier, which is shown by the dotted line, makes a rising transition at the same value of VIN1 as the output signal VAO of the differential amplifier makes a falling transition.

As mentioned above, a comparator according to an embodiment of the invention is able to increase the noise immunity without decreasing the operable frequency range of the input signal by including a hysteresis circuit at the output terminal of the differential amplifier.

While embodiments of the invention and its advantages have been described in detail, it should be understood that various changes, substitutions and alterations can be made herein without departing from the scope of the invention as defined by appended claims.

What is claimed is:

1. A comparator comprising:

a differential amplifier configured to amplify a difference signal corresponding to a difference between input signals of the differential amplifier; and a hysteresis circuit configured to set up a first transition threshold voltage and a second transition threshold voltage where the second transition threshold voltage is different from the first transition threshold voltage, and configured to generate a hysteresis output signal that makes a transition at the first transition threshold voltage when the difference signal changes in a first direction, and makes a transition at the second transition threshold voltage when the difference signal changes in a second direction, the hysteresis circuit including a Schmitt trigger circuit including:

an inverting unit configured to invert a first signal, the first signal to be generated by the differential amplifier, the inverting unit including:

a pull-up driver configured to pull up an output terminal of the hysteresis circuit in response to the first signal, the pull-up driver including:

a first PMOS transistor having a source coupled to a first supply voltage and a gate to which the first signal is applied; and a second PMOS transistor having a source coupled to a drain of the first PMOS transistor and a drain coupled to the output terminal of the hysteresis circuit; and a pull-down driver configured to pull down the output terminal of the hysteresis circuit in response to the first signal, the pull-down driver including:

a first NMOS transistor having a source coupled to a second supply voltage and a gate to which the first signal is applied; and a second NMOS transistor having a source coupled to a drain of the first NMOS transistor and a drain coupled to the output terminal of the hysteresis circuit; and a hysteresis-threshold setting unit configured to set the first transition threshold voltage and the second transition threshold voltage, the hysteresis-threshold setting unit including:

a third PMOS transistor, coupled between the drain of the first PMOS transistor and a first node, configured to perform a switching operation in response to the voltage level of the output terminal of the hysteresis circuit;

a first diode coupled between the first node and the second supply voltage;

a third NMOS transistor, coupled between the drain of the first NMOS transistor and a second node, configured to perform a switching operation in response to the voltage level of the output terminal of the hysteresis circuit; and a second diode coupled between the second node and the first supply voltage;

wherein the hysteresis-threshold setting unit adjusts a turn-on voltage of the pull-up driver or a turn-on voltage of the pull-down driver in response to a voltage level of the output terminal of the hysteresis circuit.

2. The comparator of claim 1, wherein the hysteresis output signal makes the transition at the first transition threshold voltage when the difference signal rises and makes the transition at the second transition threshold voltage when the difference signal falls.

3. The comparator of claim 1, wherein the first diode comprises a transistor having a drain and a gate commonly connected to the first node and a source coupled to the second supply voltage.

4. The comparator of claim 1, wherein the second diode comprises a transistor having a drain and a gate commonly connected to the second node and a source coupled to the first supply voltage.

5. The comparator of claim 1, wherein the hysteresis-threshold setting unit turns on the third NMOS transistor to increase a voltage level of a source of the second NMOS transistor and to increase a turn on voltage of the second NMOS transistor when the voltage level of the output terminal of the hysteresis circuit has a first logic level.

6. The comparator of claim 1, wherein the hysteresis-threshold setting unit turns on the third PMOS transistor to decrease a voltage level of a source of the second PMOS transistor and to decrease a turn on voltage of the second PMOS transistor when the voltage level of the output terminal of the hysteresis circuit has a second logic level.

7. The comparator of claim 1 further comprising a buffer circuit configured to buffer the hysteresis output signal.

8. The comparator of claim 7, wherein the buffer circuit includes an inverter configured to invert the hysteresis output signal.

* * * * *